(12) United States Patent
Hong et al.

(10) Patent No.: US 10,020,184 B2
(45) Date of Patent: Jul. 10, 2018

(54) METHOD FOR CLEANING SUBSTRATE

(71) Applicant: TAIWAN SEMICONDUCTOR MANUFACTURING CO., LTD., Hsinchu (TW)

(72) Inventors: Shih-Ping Hong, Hsinchu County (TW); Yu-Cheng Liu, Zhubei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/454,134

(22) Filed: Mar. 9, 2017

(65) Prior Publication Data

US 2017/0178895 A1 Jun. 22, 2017

Related U.S. Application Data

(62) Division of application No. 14/753,735, filed on Jun. 29, 2015, now Pat. No. 9,595,448.

(51) Int. Cl.
*H01L 21/02* (2006.01)
*H01L 21/3213* (2006.01)
(Continued)

(52) U.S. Cl.
CPC ...... *H01L 21/02071* (2013.01); *B08B 7/0035* (2013.01); *B08B 9/0865* (2013.01);
(Continued)

(58) Field of Classification Search
CPC ......... H01L 21/02041; H01L 21/02301; H01L 21/02661; H01L 21/02071; H01L 21/32136; H01L 21/67069; H01L 21/0234; H01L 21/0206; H01L 21/02063; H01L 21/31116; H01L 21/3065; C23C 14/022; B08B 7/0035

See application file for complete search history.

(56) References Cited

U.S. PATENT DOCUMENTS 5,176,792 A * 1/1993 Fullowan ............... C23F 4/00
257/E21.158
5,865,900 A * 2/1999 Lee ............... H01L 21/02071
134/1.1

(Continued)

FOREIGN PATENT DOCUMENTS

WO WO 2010/099007 A1 9/2010

OTHER PUBLICATIONS

Cho et al, "Preparation of CH3TiF and (CH3)2TiF2 from the Reaction of CH3F with Laser-Ablated Ti Atoms", Inorganic Chemistry 2004, 43, 5253-5257.*

(Continued)

*Primary Examiner* — Joseph C Nicely
(74) *Attorney, Agent, or Firm* — Birch, Stewart, Kolasch & Birch, LLP

(57) ABSTRACT

A method for cleaning a substrate is provided. The method includes providing a substrate. Metal compound residues are formed over the substrate. The method includes exposing the substrate to an organic plasma to volatilize the metal compound residues. The organic plasma is generated from a gas. The gas includes an organic gas, and the organic gas is made of a hydrocarbon compound or an alcohol compound.

20 Claims, 15 Drawing Sheets

(51) Int. Cl.
  *H01L 21/311* (2006.01)
  *H01L 21/67* (2006.01)
  *H01J 37/32* (2006.01)
  *B08B 7/00* (2006.01)
  *B08B 9/08* (2006.01)

(52) U.S. Cl.
  CPC .... *H01J 37/3244* (2013.01); *H01J 37/32834* (2013.01); *H01J 37/32862* (2013.01); *H01J 37/32871* (2013.01); *H01L 21/0206* (2013.01); *H01L 21/02334* (2013.01); *H01L 21/31116* (2013.01); *H01L 21/32136* (2013.01); *H01L 21/67069* (2013.01); *H01J 2237/334* (2013.01); *H01J 2237/335* (2013.01)

(56) References Cited

U.S. PATENT DOCUMENTS

| | | | | |
|---|---|---|---|---|
| 6,656,850 | B2* | 12/2003 | Molloy | H01L 21/31116 257/E21.008 |
| 6,869,542 | B2* | 3/2005 | Desphande | H01L 21/0276 216/51 |
| 7,288,284 | B2 | 10/2007 | Li et al. | |
| 7,312,865 | B2 | 12/2007 | Chen | |
| 2002/0192897 | A1* | 12/2002 | Molloy | H01L 21/28562 438/239 |
| 2003/0047191 | A1* | 3/2003 | Liu | B08B 7/00 134/1 |
| 2004/0103914 | A1 | 6/2004 | Cheng et al. | |
| 2007/0105390 | A1* | 5/2007 | Oh | H01L 21/31116 438/710 |
| 2008/0035170 | A1 | 2/2008 | Baek et al. | |
| 2010/0297851 | A1* | 11/2010 | Bae | G03F 7/0035 438/735 |
| 2011/0036391 | A1* | 2/2011 | McCormick | G02F 1/13439 136/252 |
| 2011/0136346 | A1* | 6/2011 | Geissbuhler | H01J 37/32357 438/710 |
| 2014/0011345 | A1* | 1/2014 | Chua | H01L 21/02658 438/503 |
| 2014/0087227 | A1 | 3/2014 | Shih et al. | |
| 2014/0190837 | A1* | 7/2014 | Maldonado | H01L 21/02425 205/557 |
| 2014/0319623 | A1* | 10/2014 | Tsai | H01L 21/82346 257/401 |
| 2015/0069622 | A1* | 3/2015 | Lu | H01L 21/0337 257/774 |
| 2015/0099369 | A1* | 4/2015 | Deshmukh | H01L 21/32135 438/720 |
| 2015/0247235 | A1 | 9/2015 | Kishi et al. | |
| 2015/0380287 | A1* | 12/2015 | Ocker | H01L 31/18 427/255.28 |
| 2016/0035542 | A1* | 2/2016 | Hausmann | H01J 37/32449 438/710 |
| 2017/0200601 | A1* | 7/2017 | Song | H01L 21/02068 |
| 2017/0213709 | A1* | 7/2017 | Wu | H01J 37/32862 |
| 2017/0221684 | A1* | 8/2017 | Nishino | H01L 21/683 156/345.29 |

OTHER PUBLICATIONS

Fuller, Lynn, "Plasma Etching", https://people.rit.edu/lffeee/Plasma_Etch.pdf, Apr. 2013.*
Rack, Philip, "Plasma Etching Outline", Date Unknown, https://wcam.engr.wisc.edu/Public/Reference/PlasmaEtch/Etching.pdf.*

* cited by examiner

US 10,020,184 B2

METHOD FOR CLEANING SUBSTRATE

CROSS REFERENCE

This application is a Divisional of application Ser. No. 14/753,735, filed Jun. 29, 2015.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
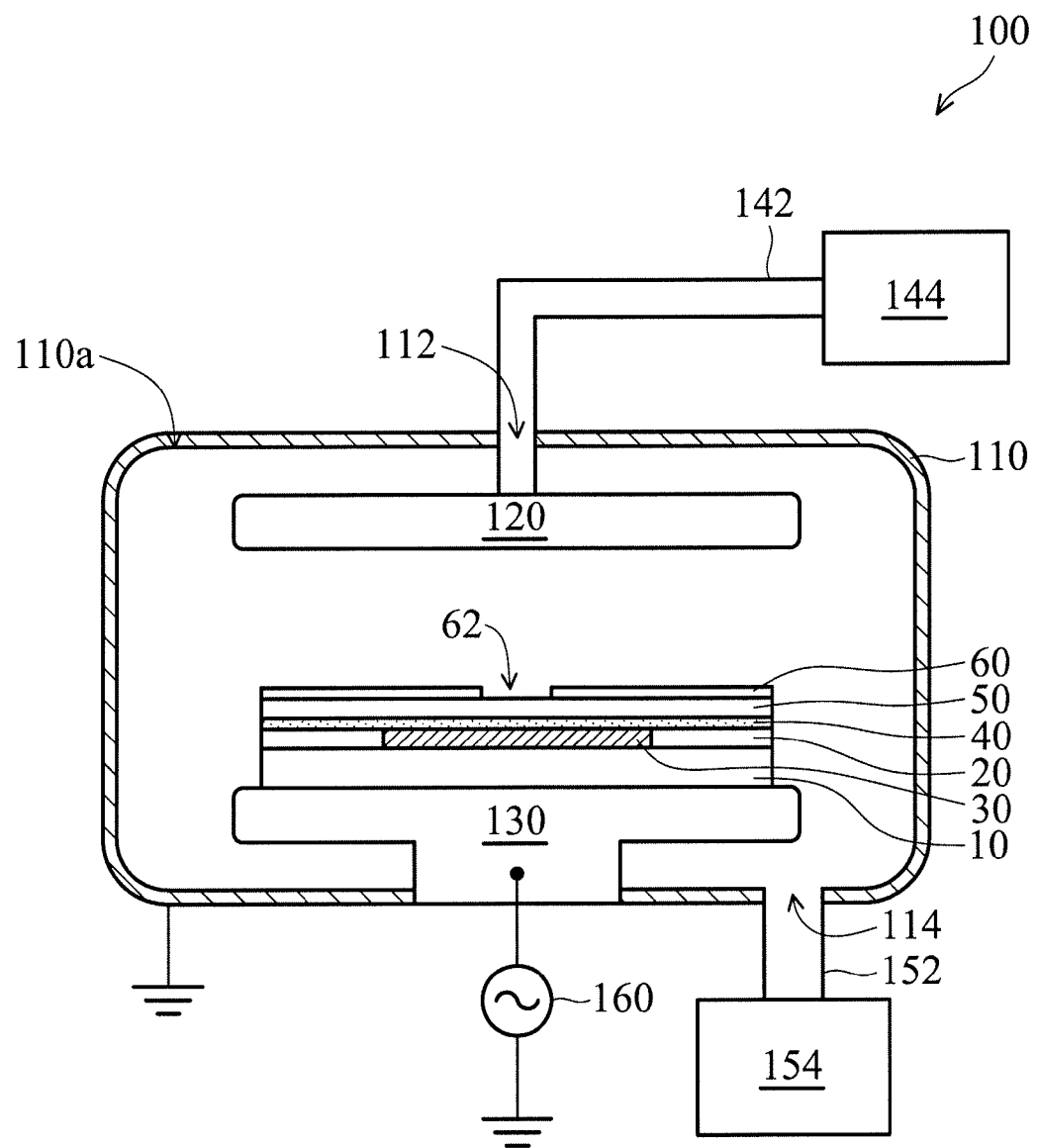
FIGS. 1A-1C are cross-sectional views of various stages of a process for cleaning a plasma processing chamber, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
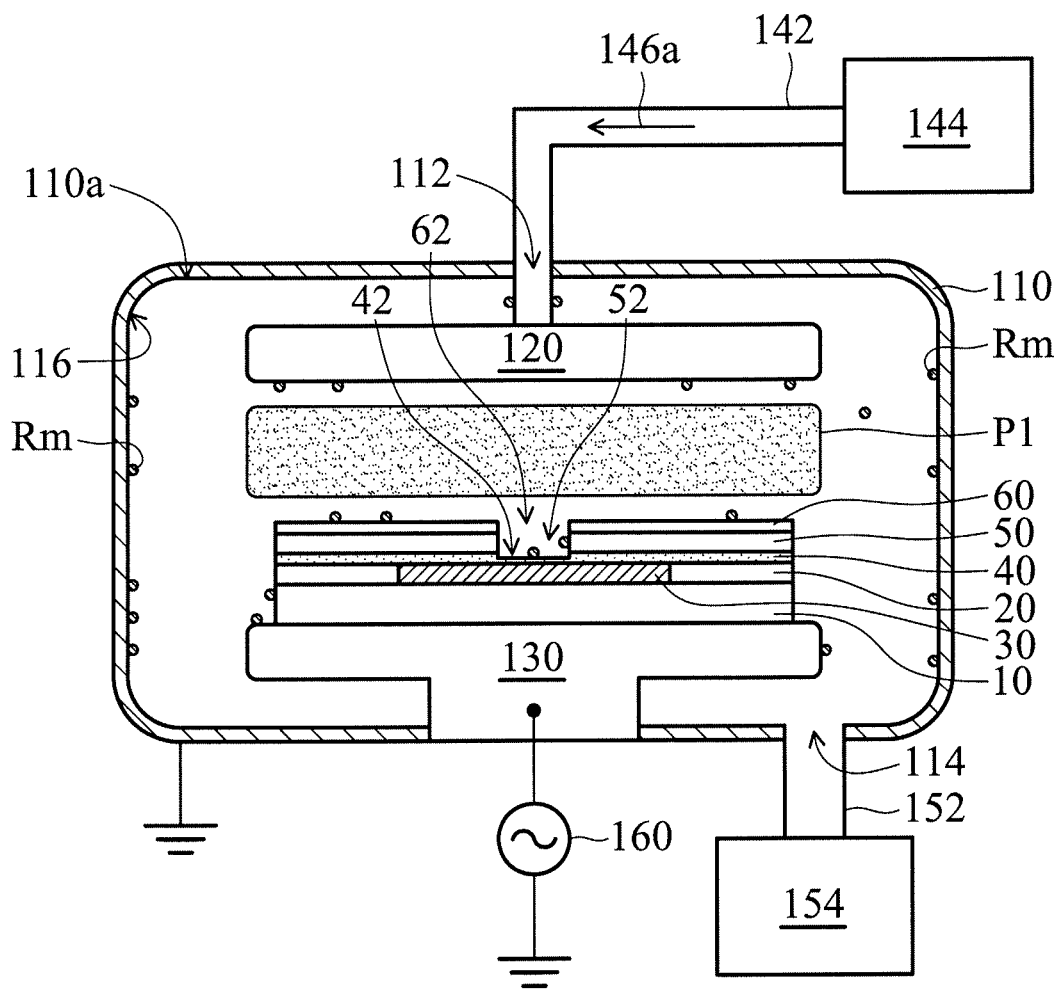
Figure 1C:
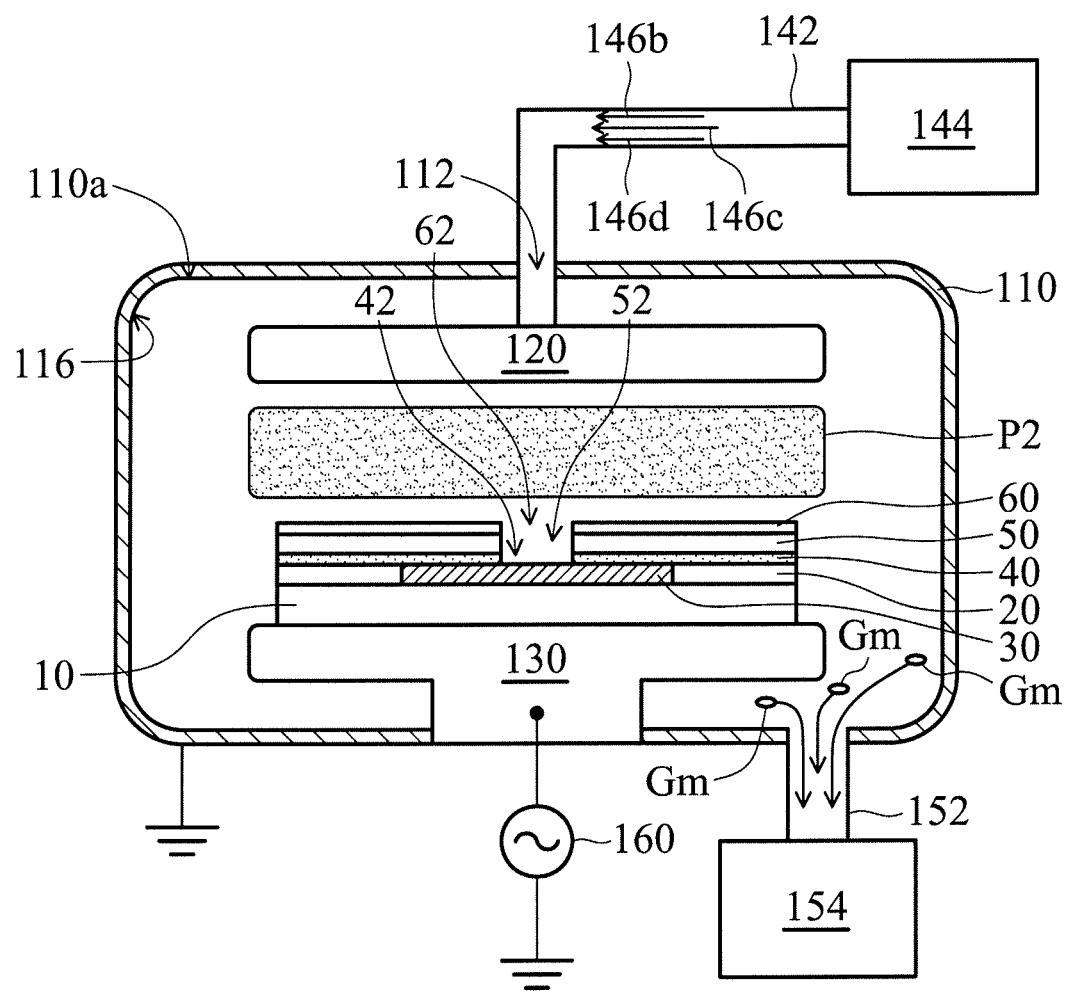

FIGS. 1A-1C are cross-sectional views of various stages of a process for cleaning a plasma processing chamber, in accordance with some embodiments. As shown in FIG. 1A, a plasma-processing apparatus 100 is provided, in accordance with some embodiments. The plasma-processing apparatus 100 includes a housing 110, an upper electrode plate 120, and a lower electrode pedestal 130, in accordance with some embodiments.

As shown in FIG. 1A, a plasma processing chamber 110a is in the housing 110, in accordance with some embodiments. The upper electrode plate 120 and the lower electrode pedestal 130 are located in the plasma processing chamber 110a, in accordance with some embodiments. The upper electrode plate 120 is over the lower electrode pedestal 130, in accordance with some embodiments. The upper electrode plate 120 includes a gas shower plate, in accordance with some embodiments.

The housing 110 has a gas inlet 112, in accordance with some embodiments. In some embodiments, the plasma-processing apparatus 100 further includes a gas-supply pipe 142 and a processing gas-supply source 144. The gas-supply pipe 142 connects the processing gas-supply source 144 to the upper electrode plate 120 through the gas inlet 112, in accordance with some embodiments. The processing gas-supply source 144 is configured to supply a processing gas into the processing chamber 110a through the gas-supply pipe 142, in accordance with some embodiments.

The upper electrode plate 120 is configured to control the flow of the processing gas through gas holes of the upper electrode plate 120, in accordance with some embodiments. The upper electrode plate 120 is also configured to serve as an upper electrode in a plasma process, in accordance with some embodiments. The upper electrode plate 120 includes conductive materials. The upper electrode plate 120 includes, for example, silicon or quartz.

The lower electrode pedestal 130 is configured to support a substrate 10 and serves as a lower electrode during a plasma process, in accordance with some embodiments. The lower electrode pedestal 130 may include an electrostatic chuck. The substrate 10 includes, for example, a wafer. The wafer includes, for example, a silicon wafer.

As shown in FIG. 1A, a dielectric layer 20 is formed over the substrate 10, in accordance with some embodiments. The dielectric layer 20 is made of a suitable dielectric material, such as silicon oxide, silicon oxynitride, borosilicate glass (BSG), phosphoric silicate glass (PSG), borophosilicate glass (BPSG), fluorinated silicate glass (FSG), low-k material, porous dielectric material, or a combination thereof, in accordance with some embodiments. In some embodiments, the dielectric layer 20 is formed using a CVD process, HDPCVD process, spin-on process, sputtering process, another applicable process, or a combination thereof.

As shown in FIG. 1A, a conductive structure 30 is formed over the substrate 10, in accordance with some embodiments. The conductive structure 30 is embedded in the dielectric layer 20, in accordance with some embodiments. The conductive structure 30 includes a copper structure, an aluminum structure, a tungsten structure, or another suitable structure. The conductive structure 30 includes a conductive line, a conductive via, or another suitable conductive structure.

As shown in FIG. 1A, an etch stop layer 40 is formed over the dielectric layer 20 and the conductive structure 30, in accordance with some embodiments. The etch stop layer 40 includes an aluminum compound, a titanium compound, a gallium compound, or an indium compound. The etch stop layer 40 includes metal nitride, metal oxynitride or another suitable metal compound.

The metal nitride includes aluminum nitride (AlN), titanium nitride (TiN), gallium nitride (GaN), or indium nitride (InN), in accordance with some embodiments. The metal oxynitride includes aluminum oxynitride (AlON), titanium oxynitride (TiON), gallium oxynitride (GaON), or indium oxynitride (InON), in accordance with some embodiments.

As shown in FIG. 1A, a dielectric layer 50 is formed over the etch stop layer 40, in accordance with some embodiments. The dielectric layer 50 is made of a suitable dielectric material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. In some embodiments, the dielectric layer 50 is formed using a CVD process, HDPCVD process, spin-on process, sputtering process, another applicable process, or a combination thereof.

As shown in FIG. 1A, a mask layer 60 is formed over the dielectric layer 50, in accordance with some embodiments. The mask layer 60 includes a photoresist material, silicon oxide, silicon nitride (e.g., $Si_3N_4$), SiON, SiC, SiOC, or a combination thereof. The mask layer 60 may be formed by a deposition process (or a spin-on coating process) and an etching process. The deposition process includes a chemical vapor deposition (CVD) process, a physical vapor deposition (PVD) process, an atomic layer deposition (ALD) process, or another applicable process. The mask layer 60 has an opening 62 exposing a portion of the dielectric layer 50, in accordance with some embodiments.

As shown in FIG. 1A, the housing 110 has a gas outlet 114, in accordance with some embodiments. In some embodiments, the plasma-processing apparatus 100 further includes a gas exhaust pipe 152 and a gas exhaust unit 154. The gas exhaust pipe 152 connects the gas exhaust unit 154 to the gas outlet 114, in accordance with some embodiments. The gas exhaust unit 154 is configured to exhaust the processing gas and gaseous compounds in the plasma processing chamber 110a and to depressurize the plasma processing chamber 110a, in accordance with some embodiments. In some embodiments, the internal pressure of the plasma processing chamber 110a is adjusted by the gas exhaust unit 154. The gas exhaust unit 154 includes, for example, a vacuum pump.

In some embodiments, as shown in FIG. 1A, the plasma-processing apparatus 100 further includes a high-frequency power supply 160. The high-frequency power supply 160 is electrically connected to the lower electrode pedestal 130. The high-frequency power supply 160 is configured to output high-frequency power (e.g., radio-frequency power) to the lower electrode pedestal 130, in accordance with some embodiments. The high-frequency power supply 160 may convert the processing gas to plasma with a high-frequency discharge in the plasma processing chamber 110a, in accordance with some embodiments.

In some embodiments, the upper electrode plate 120 is electrically grounded. In some other embodiments, the upper electrode plate 120 is electrically connected to a high-frequency power supply (not shown). In other embodiments (not shown), the upper electrode plate 120 is electrically connected to a high-frequency power supply, and the lower electrode pedestal 130 is electrically grounded.

As shown in FIG. 1B, a processing gas 146a is introduced from the processing gas-supply source 144 into the plasma processing chamber 110a, in accordance with some embodiments. The processing gas 146a passes through the gas holes (not shown) of the upper electrode plate 120 and flows between the upper electrode plate 120 and the lower electrode pedestal 130, in accordance with some embodiments. The processing gas 146a includes fluorine, such as $NF_3$ or $CF_4$, in accordance with some embodiments. The processing gas 146a further includes oxygen, nitrogen, and/or argon, in accordance with some embodiments.

By turning on the high-frequency power supply 160, the high-frequency power is applied to the lower electrode pedestal 130, in accordance with some embodiments. The processing gas 146a passing through the gas holes of the upper electrode plate 120 is excited (or converted) into a plasma P1 by a high-frequency discharge between the upper electrode plate 120 and the lower electrode pedestal 130, in accordance with some embodiments.

In some embodiments, a plasma etching process is performed using the plasma P1. The plasma etching process removes portions of the etch stop layer 40 and the dielectric layer 50 under the opening 62, in accordance with some embodiments. The plasma etching process forms an opening 52 in the dielectric layer 50 and a recess 42 in the etch stop layer 40, in accordance with some embodiments. The opening 52 is over the recess 42 and exposes the recess 42, in accordance with some embodiments. The recess 42 does not pass through the etch stop layer 40, in accordance with some embodiments.

During the plasma etching process, metal compound residues Rm are formed in the plasma processing chamber 110a, in accordance with some embodiments. The metal compound residues Rm are formed from the etch stop layer 40, in accordance with some embodiments. The metal compound residues Rm are in a solid state, in accordance with some embodiments.

The metal compound residues Rm are formed over (or adhered to) an interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and/or the gas-supply pipe 142, in accordance with some embodiments.

The metal compound residues Rm includes a Group III-A metal fluoride, a Group III-A metal oxide, a Group III-A metal nitride, a Group IV-B metal fluoride, a Group IV-B metal oxide, or a Group IV-B metal nitride, in accordance with some embodiments. The Group III-A metal fluoride includes $AlF_3$, $GaF_3$, or $InF_3$, in accordance with some embodiments.

The Group III-A metal oxide includes $Al_2O_3$, $Ga_2O_3$, or $In_2O_3$, in accordance with some embodiments. The Group III-A metal nitride includes AlN, GaN, or InN, in accordance with some embodiments. The Group IV-B metal fluoride includes $TiF_3$, in accordance with some embodiments. The Group IV-B metal oxide includes $TiO_2$, in accordance with some embodiments. The Group IV-B metal nitride includes TiN, in accordance with some embodiments.

Since the metal compound residues Rm contaminate the plasma processing chamber 110a, a cleaning process is performed to clean the plasma processing chamber 110a, in accordance with some embodiments. The cleaning process removes the metal compound residues Rm from the plasma processing chamber 110a, as shown in FIGS. 1B and 1C, in accordance with some embodiments.

The cleaning process includes introducing an organic gas 146b into the plasma processing chamber 110a, in accordance with some embodiments. The flow rate of the organic gas 146b ranges from about 5 sccm (standard cubic centimeter per minute) to about 500 sccm, in accordance with some embodiments. The flow rate of the organic gas 146b ranges from about 30 sccm to about 200 sccm, in accordance with some embodiments.

The organic gas 146b includes an organic compound, in accordance with some embodiments. The organic compound includes carbon and hydrogen, in accordance with some embodiments. The organic compound includes a hydrocarbon compound or an alcohol compound, in accordance with some embodiments. The hydrocarbon compound includes alkane (e.g., $CH_4$ or $C_2H_6$) or alkene (e.g., $C_2H_4$ or $C_3H_6$), in accordance with some embodiments. In some embodiments, the hydrocarbon compound includes alkyne (e.g., $C_2H_2$). The alcohol compound includes $CH_3OH$, $C_2H_5OH$, $C_3H_7OH$, or another suitable alcohol compound.

The cleaning process further includes introducing a chain termination gas 146c into the plasma processing chamber 110a, in accordance with some embodiments. The chain termination gas 146c is mixed with the organic gas 146b, in accordance with some embodiments. The chain termination gas 146c includes hydrogen, carbon oxide, carbon dioxide, oxygen, a combination thereof, or another suitable chain termination compound (or element). The flow rate of the chain termination gas 146c ranges from about 10 sccm to about 1000 sccm, in accordance with some embodiments. The flow rate of the chain termination gas 146c ranges from about 50 sccm to about 500 sccm, in accordance with some embodiments.

The cleaning process further includes introducing a dilution gas 146d into the plasma processing chamber 110a, in accordance with some embodiments. The dilution gas 146d is mixed with the organic gas 146b and the chain termination gas 146c, in accordance with some embodiments. The organic gas 146b is diluted by the dilution gas 146d, in accordance with some embodiments.

The dilution gas 146d includes an inert gas or a nitrogen gas ($N_2$), in accordance with some embodiments. The inert gas includes helium (He), neon (Ne), argon (Ar), krypton (Kr), xenon (Xe), or radon (Rn), in accordance with some embodiments. The flow rate of the dilution gas 146d ranges from about 0.01 sccm to about 2000 sccm, in accordance with some embodiments. The flow rate of the dilution gas 146d ranges from about 100 sccm to about 800 sccm, in accordance with some embodiments.

The cleaning process includes generating an organic plasma P2 by exciting the organic gas 146b, in accordance with some embodiments. The organic gas 146b is excited into a plasma state by a radio frequency (RF) power ranging from about 200 W to about 5000 W, in accordance with some embodiments. The RF power ranges from about 1000 W to about 2000 W, in accordance with some embodiments.

During the generation of the organic plasma P2, the chain termination gas 146c is excited as well to terminate chain propagation into polymers, which prevents the organic plasma P2 from polymerizing into macromolecule groups and depositing over the interior surface 116, in accordance with some embodiments.

Furthermore, during the generation of the organic plasma P2, the dilution gas 146d diluting the organic gas 146b prevents the organic plasma P2 from polymerizing into macromolecule groups and depositing over the interior surface 116, in accordance with some embodiments.

The organic plasma P2 reacts with the metal compound residues Rm in the plasma processing chamber 110a to volatilize the metal compound residues Rm into a gaseous metal compound Gm, in accordance with some embodiments. The gaseous metal compound Gm is in a gas state, in accordance with some embodiments. The cleaning process includes removing the gaseous metal compound Gm from the plasma processing chamber 110a using the gas exhaust unit 154, in accordance with some embodiments.

The gaseous metal compound Gm includes metal organics, in accordance with some embodiments. The metal organics includes an alkyl metal compound, an alkoxy metal compound, an alkoxy alkyl metal compound, or a combination thereof, in accordance with some embodiments. The alkyl metal compound includes an alkyl aluminum compound, an alkyl titanium compound, an alkyl gallium compound, or an alkyl indium compound, or a combination thereof, in accordance with some embodiments.

The alkyl metal compound includes $Al(CH_3)_3$, $Al(CH_2CH_3)_3$, $Al(CH_2CH_2CH3)_3$, $Al(CH_2CH(CH_3)_2)_3$, $(CH_3)_2AlH$, $(C_2H_5)_2AlH$, $(CH_2CH(CH_3)_2)_2AlH$, $Ga(CH_3)_3$, $Ga(C_2H_5)_3$, $In(CH_3)_3$, $In(C_2H_5)_3$, $Ti(CH_3)_4$, $Ti(C_2H_5)_4$, $Al(CH(CH_3)_2)_3$, $(CH(CH_3)_2)_2AlH$, or a combination thereof, in accordance with some embodiments.

The alkoxy metal compound includes an alkoxy aluminum compound, an alkoxy titanium compound, an alkoxy gallium compound, or an alkoxy indium compound, or the like. The alkoxy metal compound includes $Ti(OCH_2CH_3)_4$, $Ti(OCH(CH_3)_2)_4$, $Al(OCH_2CH_3)_3$, $Al(OCH(CH_3)_2)_3$, $Ga(OCH_2CH_3)_3$, $Ga(OCH(CH_3)_2)_3$, $In(OCH_2CH_3)_3$, $In(OCH(CH_3)_2)_3$, or a combination thereof, in accordance with some embodiments.

The alkoxy alkyl metal compound includes an alkoxy alkyl aluminum compound, an alkoxy alkyl titanium compound, an alkoxy alkyl gallium compound, an alkoxy alkyl indium compound, or the like. The alkoxy alkyl metal compound includes $(CH_3)_2AlOCH_3$, $(CH_3)_2GaOCH_3$, $(CH_3)_2InOCH_3$, $CH_3Ti(OCH_3)_3$, or a combination thereof, in accordance with some embodiments.

The cleaning process is performed under a pressure ranging from about 5 mT (milliTorr) to about 1000 mT, in accordance with some embodiments. The cleaning process is performed under a pressure ranging from about 50 mT to about 400 mT, in accordance with some embodiments. The cleaning process is performed at a chamber temperature ranging from about 10° C. to about 250° C., in accordance with some embodiments. The cleaning process is performed at a chamber temperature ranging from about 30° C. to about 80° C., in accordance with some embodiments.

The organic plasma P2 volatilizes the metal compound residues Rm into the gaseous metal compound Gm, which is able to be removed more easily than the metal compound residues Rm in the solid state. The metal compound residues Rm in the solid state are able to be removed by an open chamber clean process. Therefore, the cleaning process using the organic plasma P2 maintains the plasma processing chamber 110a clean for a long period of time. The cleaning process using the organic plasma P2 elongates the mean time between (open chamber) clean (MTBC), therefore the cleaning process improves the process efficiency, the process yield, and the process stability.

The organic plasma P2 volatilizes the metal compound residues Rm over the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and/or the gas-supply pipe 142, in accordance with some embodiments.

Therefore, the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and the gas-supply pipe 142 are kept clean, which improves the yield of subsequent processes, in accordance with some embodiments.

In some embodiments, the organic plasma P2 also volatilizes the etch stop layer 40 exposed by the opening 52 of the dielectric layer 50. Therefore, the recess 42 passes through the etch stop layer 40 and exposes a portion of the conductive structure 30, in accordance with some embodiments.

Since a chlorine-containing plasma may damage the conductive structure 30 (e.g., a copper structure) and the silicon-containing structures (e.g., the dielectric layer 50 and the substrate 10), the plasma processing chamber 110a is substantially free of chlorine. In some embodiments, the plasma processing chamber 110a is maintained substantially free of chlorine all the time. Therefore, the cleaning process does not use chlorine-containing plasma, in accordance with some embodiments.

Figure 2:
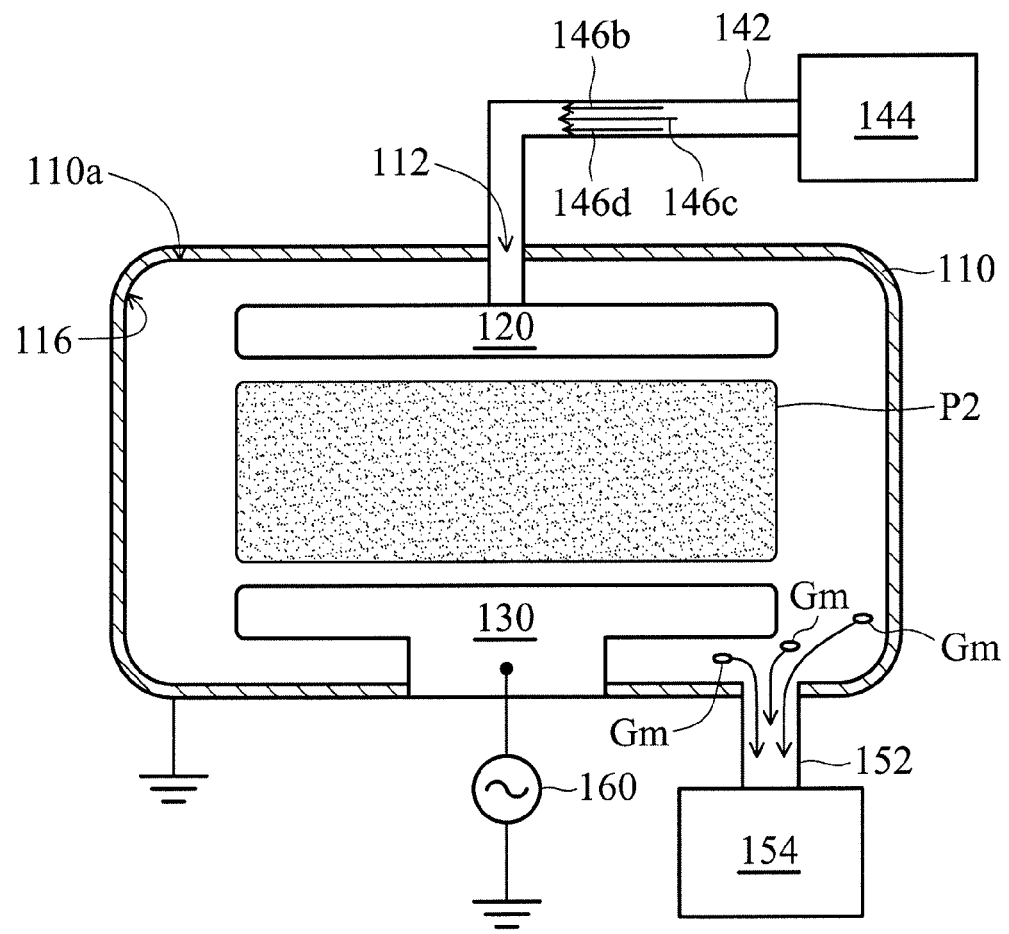
FIG. 2 is a cross-sectional view of a stage of a process for cleaning a plasma processing chamber, in accordance with some embodiments.

FIG. 2 is a cross-sectional view of a stage of a process for cleaning a plasma processing chamber, in accordance with some embodiments. The cleaning process of FIG. 2 is similar to that of FIG. 1C, except that the cleaning process of FIG. 2 is a wafer-less cleaning process, in accordance with some embodiments.

In some embodiments, the cleaning process of FIG. 2 is also referred to as a wafer-less auto-clean (WAC) process. Elements designated by the same reference numbers as those in FIGS. 1A-1C have structures and materials similar thereto. Therefore, the detailed descriptions thereof will not be repeated herein.

After the step of FIG. 1B, as shown in FIG. 2, the substrate 10 is removed from the plasma processing chamber 110a, in accordance with some embodiments. Thereafter, the cleaning process of FIG. 1C is performed to remove the metal compound residues Rm from the plasma processing chamber 110a.

The cleaning process includes introducing the organic gas 146b into the plasma processing chamber 110a, in accordance with some embodiments. The cleaning process further includes introducing the chain termination gas 146c into the plasma processing chamber 110a, in accordance with some embodiments. The cleaning process further includes introducing the dilution gas 146d into the plasma processing chamber 110a, in accordance with some embodiments.

The cleaning process includes generating the organic plasma P2 by exciting the organic gas 146b, in accordance with some embodiments. During the generation of the organic plasma P2, the chain termination gas 146c is excited as well to terminate chain propagation into polymers, which prevents the organic plasma P2 from polymerizing into macromolecule groups and depositing over the interior surface 116, in accordance with some embodiments.

Furthermore, during the generation of the organic plasma P2, the dilution gas 146d diluting the organic gas 146b prevents the organic plasma P2 from polymerizing into macromolecule groups and depositing over the interior surface 116, in accordance with some embodiments.

As shown in FIGS. 1B and 2, the organic plasma P2 reacts with metal compound residues Rm in the plasma processing chamber 110a to volatilize the metal compound residues Rm into the gaseous metal compound Gm, in accordance with some embodiments. The cleaning process includes removing the gaseous metal compound Gm from the plasma processing chamber 110a using the gas exhaust unit 154, in accordance with some embodiments.

Figure 3A:
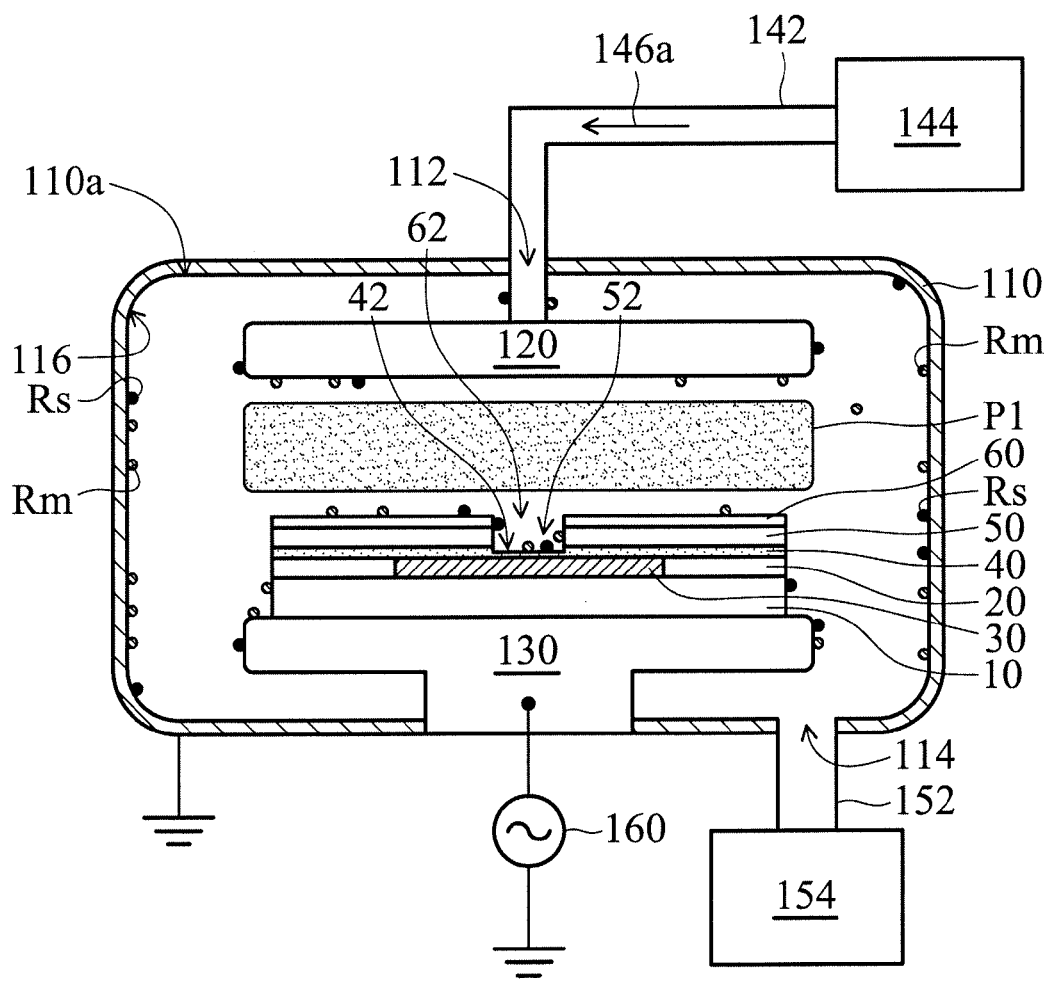
FIGS. 3A-3C are cross-sectional views of various stages of a process for cleaning a plasma processing chamber, in accordance with some embodiments.
Figure 3B:
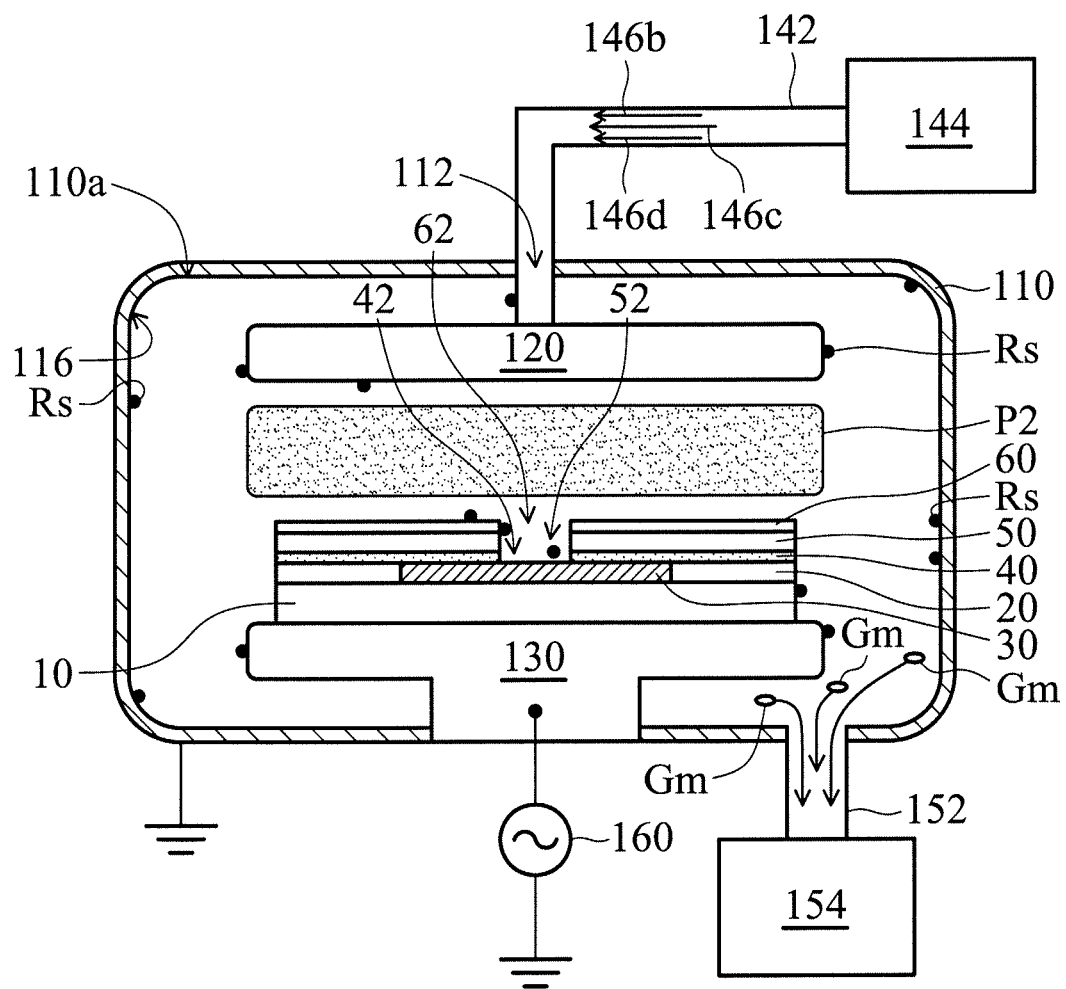
Figure 3C:
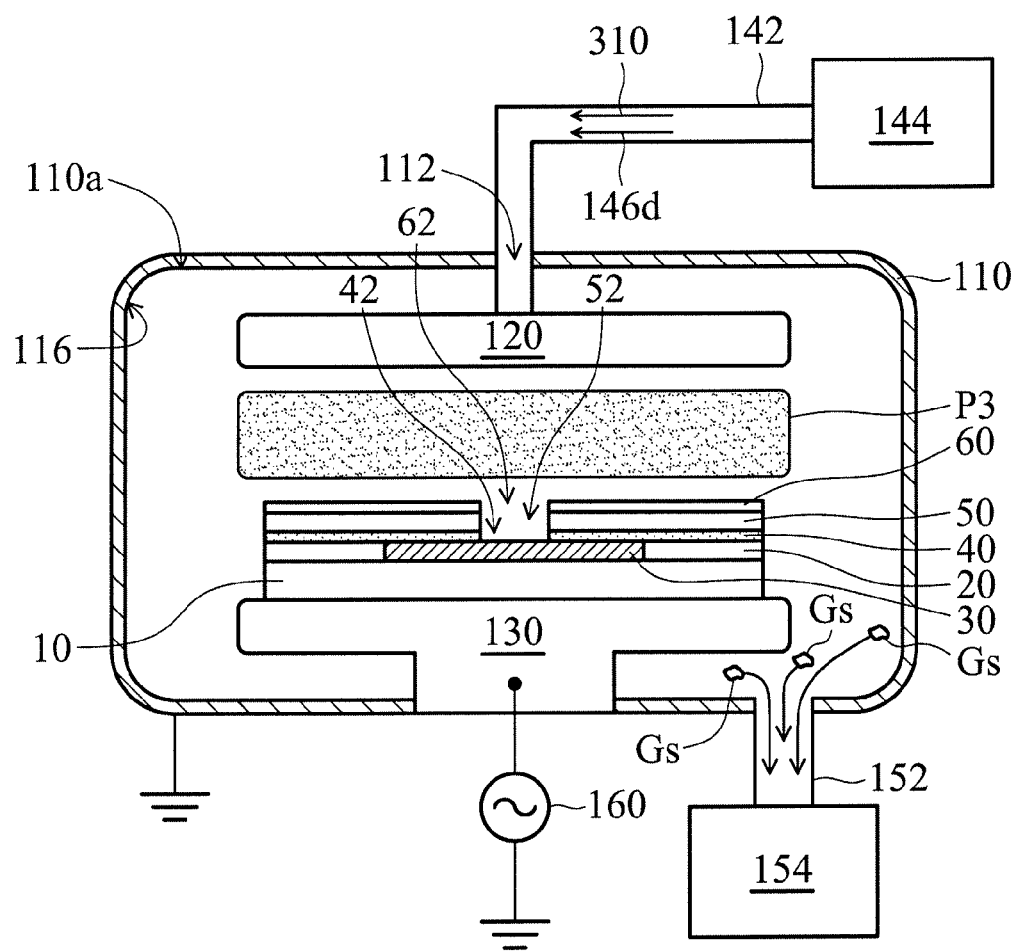

FIGS. 3A-3C are cross-sectional views of various stages of a process for cleaning a plasma processing chamber, in accordance with some embodiments. The cleaning process of FIGS. 3A-3C is similar to the cleaning process of FIGS. 1A-1C, except that the cleaning process of FIGS. 3A-3C further comprises a step for cleaning silicon-containing residues. Elements designated by the same reference numbers as those in FIGS. 1A-1C have structures and materials similar thereto. Therefore, the detailed descriptions thereof will not be repeated herein.

After the step of FIG. 1A, as shown in FIG. 3A, a processing gas 146a is introduced from the processing gas-supply source 144 into the plasma processing chamber 110a, in accordance with some embodiments. The processing gas 146a passes through the gas holes (not shown) of the upper electrode plate 120 and flows between the upper electrode plate 120 and the lower electrode pedestal 130, in accordance with some embodiments. The processing gas 146a includes fluorine, such as $NF_3$ or $CF_4$, in accordance with some embodiments. The processing gas 146a further includes oxygen, nitrogen, and/or argon, in accordance with some embodiments.

By turning on the high-frequency power supply 160, the high-frequency power is applied to the lower electrode pedestal 130, in accordance with some embodiments. The processing gas 146a passing through the gas holes of the upper electrode plate 120 is excited (or converted) into a plasma P1 by a high-frequency discharge between the upper electrode plate 120 and the lower electrode pedestal 130, in accordance with some embodiments.

In some embodiments, a plasma etching process is performed using the plasma P1. The plasma etching process removes portions of the etch stop layer 40 and the dielectric layer 50 under the opening 62, in accordance with some embodiments. The plasma etching process forms an opening 52 in the dielectric layer 50 and a recess 42 in the etch stop layer 40, in accordance with some embodiments. The opening 52 is over the recess 42 and exposes the recess 42, in accordance with some embodiments. The recess 42 does not pass through the etch stop layer 40, in accordance with some embodiments.

During the plasma etching process, metal compound residues Rm and silicon-containing residues Rs are formed in the plasma processing chamber 110a, in accordance with some embodiments. The metal compound residues Rm are formed from the etch stop layer 40, in accordance with some embodiments. The silicon-containing residues Rs are formed from the dielectric layer 50, in accordance with some embodiments. The metal compound residues Rm and the silicon-containing residues Rs are in a solid state, in accordance with some embodiments.

The metal compound residues Rm and the silicon-containing residues Rs are formed over (or adhered to) the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and/or the gas-supply pipe 142, in accordance with some embodiments.

Since the metal compound residues Rm and the silicon-containing residues Rs contaminate the plasma processing chamber 110a, a cleaning process is performed to remove the metal compound residues Rm and the silicon-containing residues Rs from the plasma processing chamber 110a, in accordance with some embodiments.

As shown in FIG. 3B, the cleaning process includes introducing an organic gas 146b into the plasma processing chamber 110a, in accordance with some embodiments. The cleaning process further includes introducing a chain termination gas 146c and/or a dilution gas 146d into the plasma processing chamber 110a, in accordance with some embodiments. The chain termination gas 146c and the dilution gas 146d are mixed with the organic gas 146b, in accordance with some embodiments. The organic gas 146b is diluted by the dilution gas 146d, in accordance with some embodiments.

The cleaning process includes generating an organic plasma P2 by exciting the organic gas 146b, in accordance with some embodiments. During the generation of the organic plasma P2, the chain termination gas 146c is excited as well to terminate chain propagation into polymers, in accordance with some embodiments.

The organic plasma P2 reacts with metal compound residues Rm in the plasma processing chamber 110a to volatilize the metal compound residues Rm into a gaseous metal compound Gm, in accordance with some embodiments. The cleaning process includes removing the gaseous metal compound Gm from the plasma processing chamber 110a using the gas exhaust unit 154, in accordance with some embodiments.

As shown in FIG. 3C, the cleaning process includes introducing a fluorine-containing gas 310 into the plasma processing chamber 110a, in accordance with some embodiments. The fluorine-containing gas 310 passes through the upper electrode plate 120 and flows between the upper electrode plate 120 and the lower electrode pedestal 130, in accordance with some embodiments. The fluorine-containing gas 310 includes fluorine, in accordance with some embodiments. The fluorine-containing gas 310 includes $NF_3$, $CF_4$, $C_4F_6$, or $C_4F_8$, in accordance with some embodiments.

The cleaning process further includes introducing a dilution gas 146d into the plasma processing chamber 110a, in accordance with some embodiments. The dilution gas 146d is mixed with the fluorine-containing gas 310, in accordance with some embodiments. The fluorine-containing gas 310 is diluted by the dilution gas 146d, in accordance with some embodiments. The cleaning process includes generating a fluorine-containing plasma P3 by exciting the fluorine-containing gas 310, in accordance with some embodiments.

The fluorine-containing plasma P3 reacts with the silicon-containing residues Rs in the plasma processing chamber 110a to volatilize the silicon-containing residues Rs into a gaseous silicon compound Gs, in accordance with some embodiments. The gaseous silicon compound Gs includes $SiF_4$, in accordance with some embodiments. The cleaning process includes removing the gaseous silicon compound Gs from the plasma processing chamber 110a using the gas exhaust unit 154, in accordance with some embodiments.

In some other embodiments, the formation sequence of the organic plasma P2 and the fluorine-containing plasma P3 is changed. That is, the fluorine-containing plasma P3 may be formed firstly to remove the silicon-containing residues Rs, and the organic plasma P2 may be formed secondly to remove the metal compound residues Rm, in accordance with some embodiments.

The fluorine-containing plasma P3 volatilizes the silicon-containing residues Rs into the gaseous silicon compound Gs, which is able to be removed more easily than the silicon-containing residues Rs in the solid state. Therefore, the cleaning process using the fluorine-containing plasma P3 maintains the plasma processing chamber 110a clean for a long period of time. The cleaning process using the fluorine-containing plasma P3 elongates the mean time between (open chamber) clean (MTBC), therefore the cleaning process improves the process efficiency and the process yield.

The fluorine-containing plasma P3 volatilizes the silicon-containing residues Rs over the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and/or the gas-supply pipe 142, in accordance with some embodiments.

Therefore, the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and the gas-supply pipe 142 are kept clean, which improves the yield of subsequent processes, in accordance with some embodiments.

Figure 4A:
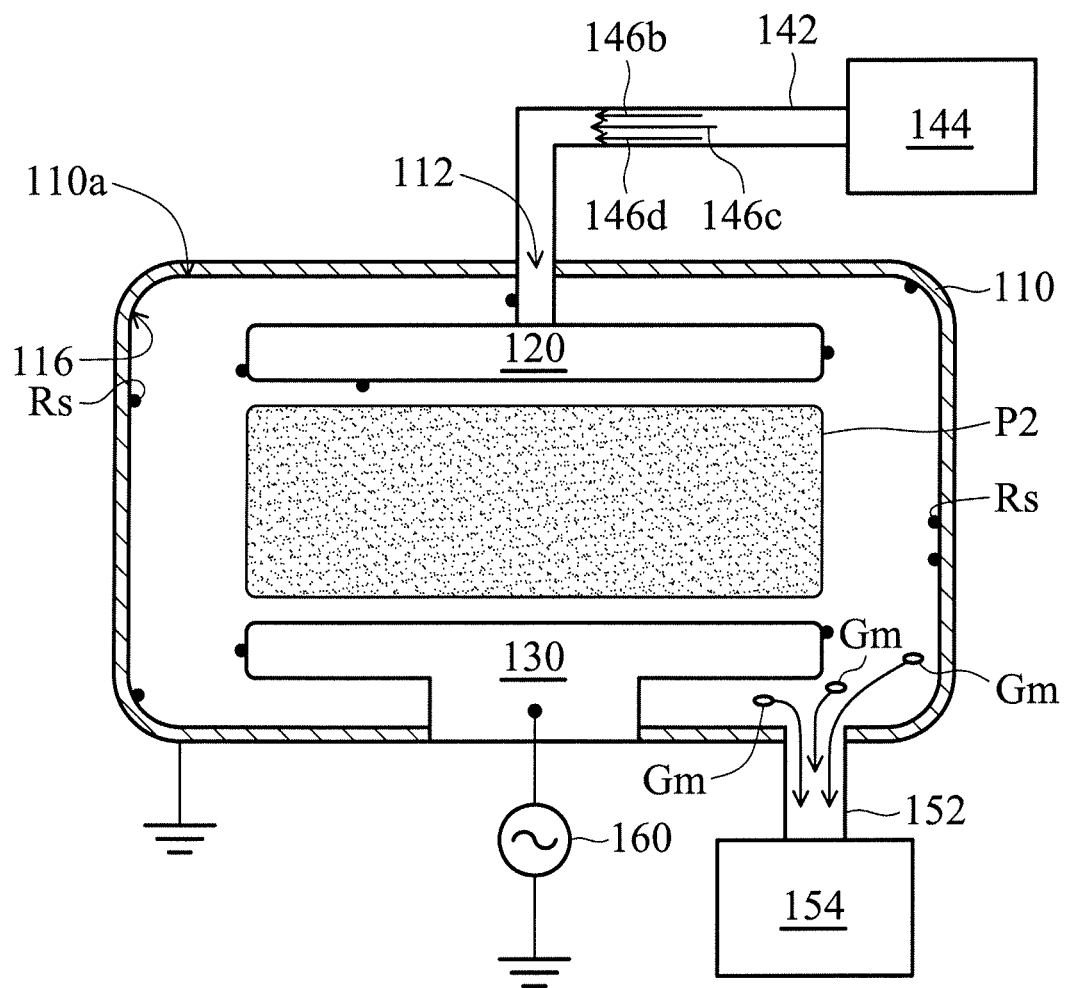
FIGS. 4A-4B are cross-sectional views of various stages of a process for cleaning a plasma processing chamber, in accordance with some embodiments.
Figure 4B:
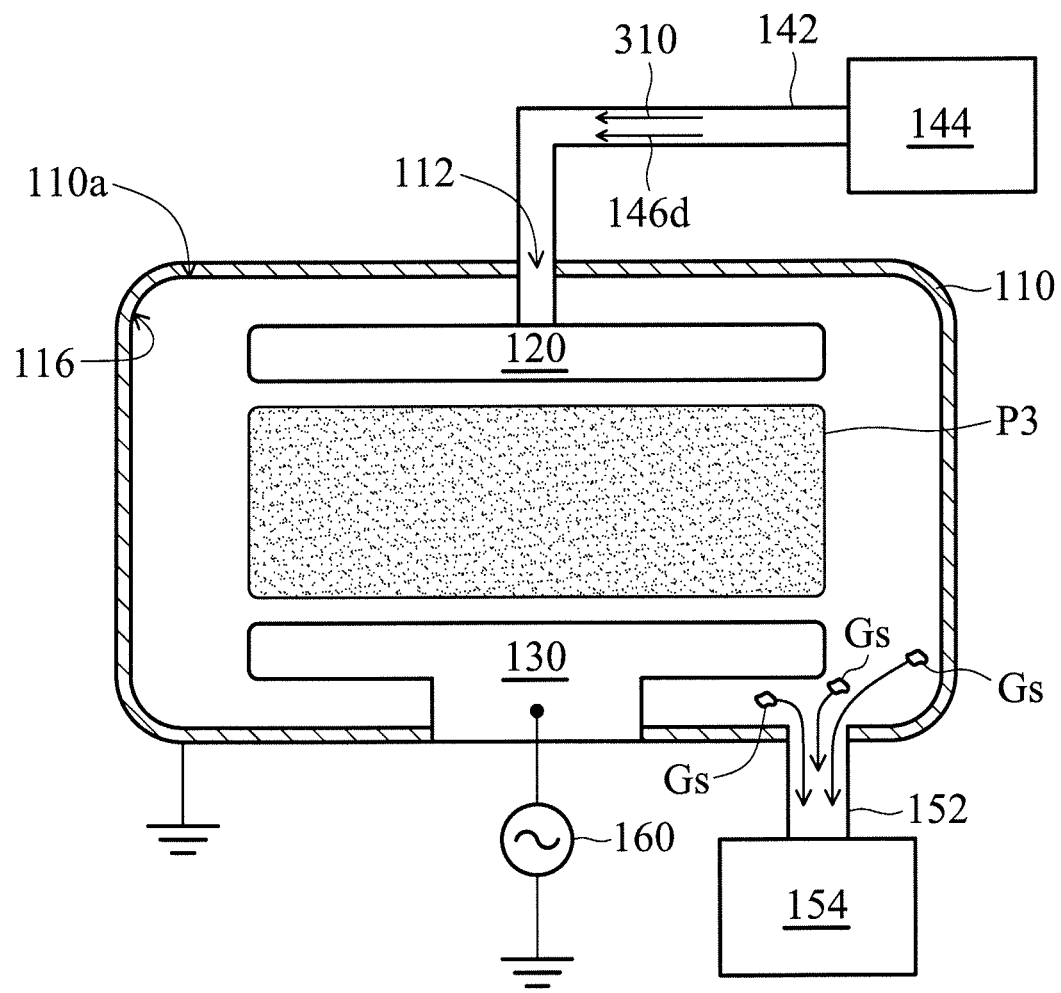

FIGS. 4A-4B are cross-sectional views of various stages of a process for cleaning a plasma processing chamber, in accordance with some embodiments. The cleaning process of FIGS. 4A-4B is similar to that of FIGS. 3B-3C, except that the cleaning process of FIGS. 4A-4B is a wafer-less cleaning process, in accordance with some embodiments.

In some embodiments, the cleaning process of FIGS. 4A-4B is also referred to as a wafer-less auto-clean (WAC) process. Elements designated by the same reference numbers as those in FIGS. 3A-3C have structures and materials similar thereto. Therefore, the detailed descriptions thereof will not be repeated herein.

After the step of FIG. 3A, as shown in FIG. 4A, the substrate 10 is removed from the plasma processing chamber 110a, in accordance with some embodiments. Thereafter, as shown in FIG. 4A, the cleaning process of FIG. 3B is performed to remove the metal compound residues Rm from the plasma processing chamber 110a, in accordance with some embodiments. Afterwards, as shown in FIG. 4B, the cleaning process of FIG. 3C is performed to remove the silicon-containing residues Rs from the plasma processing chamber 110a, in accordance with some embodiments.

Figure 5A:
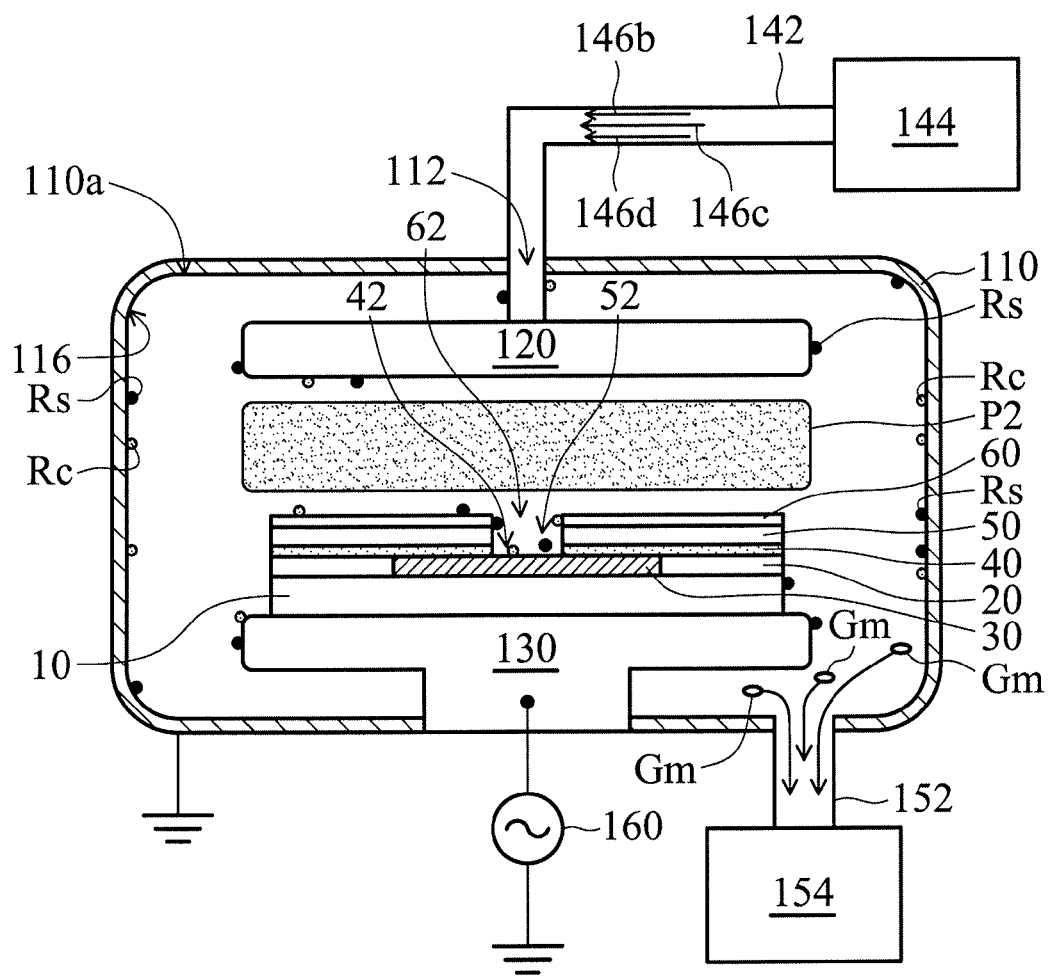
FIGS. 5A-5C are cross-sectional views of various stages of a process for cleaning a plasma processing chamber, in accordance with some embodiments.
Figure 5B:
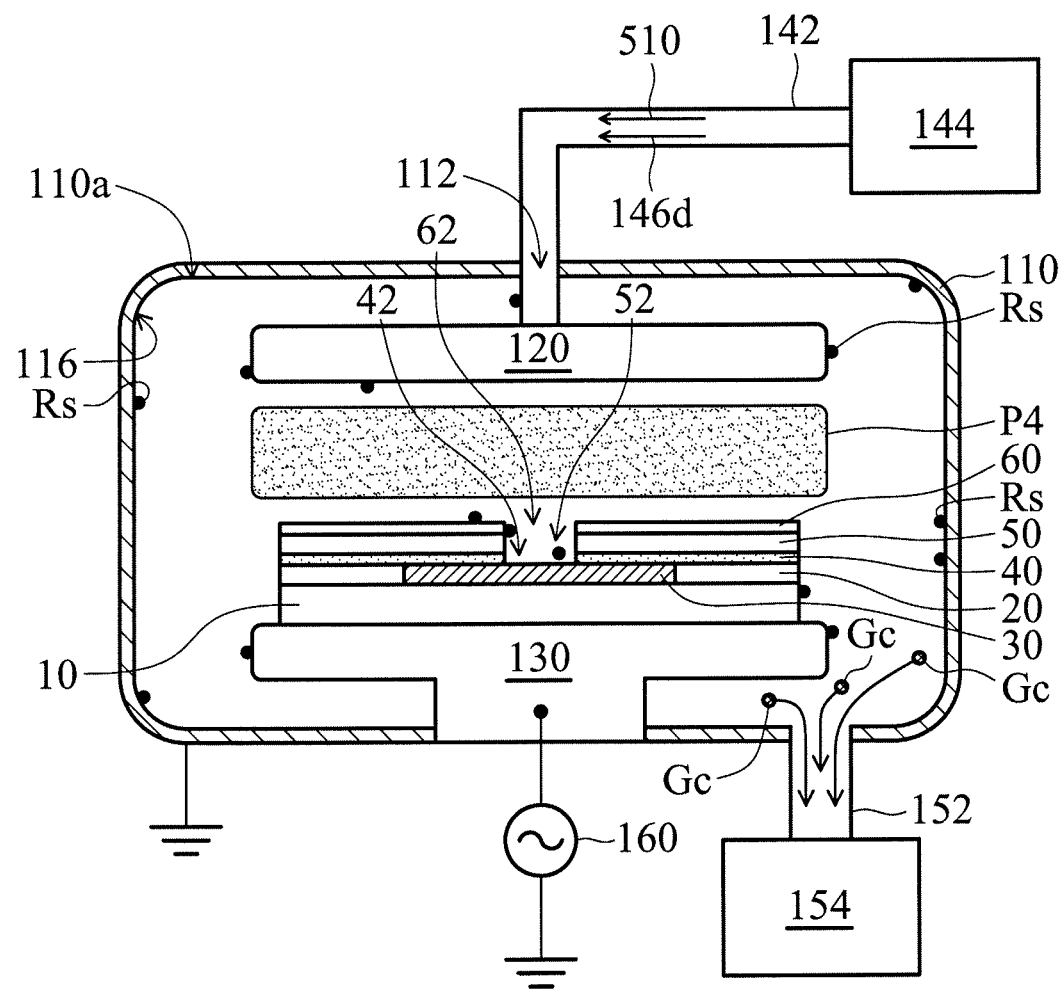
Figure 5C:
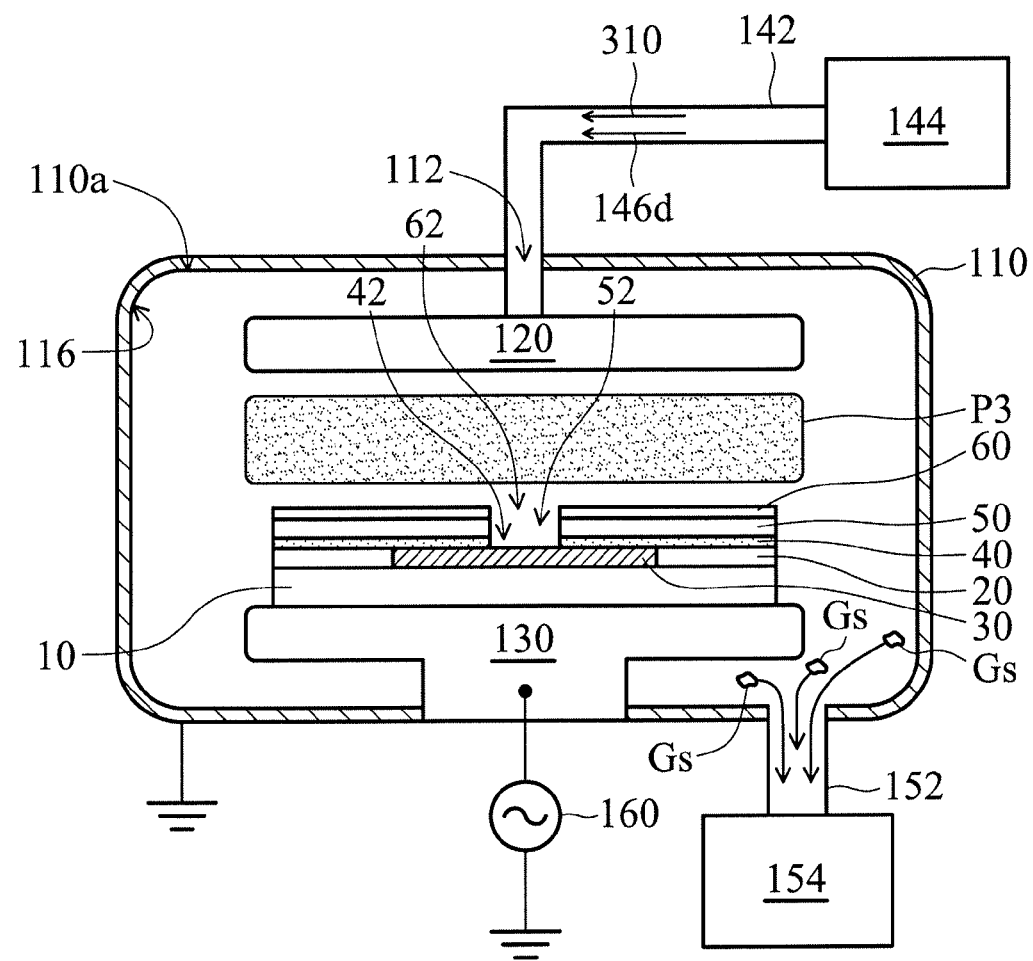

FIGS. 5A-5C are cross-sectional views of various stages of a process for cleaning a plasma processing chamber, in accordance with some embodiments. The cleaning process of FIGS. 5A-5C is similar to the cleaning process of FIGS. 3A-3C, except that the cleaning process of FIGS. 5A-5C further comprises a step for cleaning organic compound residues. Elements designated by the same reference numbers as those in FIGS. 1A-1C and 3A-3C have structures and materials similar thereto. Therefore, the detailed descriptions thereof will not be repeated herein.

After the steps of FIGS. 3A-3B, as shown in FIG. 5A, organic compound residues Rc are formed in the plasma processing chamber 110a, in accordance with some embodiments. The organic compound residues Rc are formed over the interior surface 116 of the plasma processing chamber 110a, the substrate 10, the dielectric layer 20, the etch stop layer 40, the dielectric layer 50, the mask layer 60, the upper electrode plate 120, the lower electrode pedestal 130, and/or the gas-supply pipe 142, in accordance with some embodiments. The organic compound residues Rc are formed from the polymerization of the organic plasma P2, in accordance with some embodiments.

As shown in FIG. 5B, the cleaning process includes introducing an oxygen atom-containing gas 510 into the plasma processing chamber 110a, in accordance with some embodiments. The oxygen atom-containing gas 510 includes oxygen, carbon oxide, or carbon dioxide, in accordance with some embodiments. The cleaning process further includes introducing a dilution gas 146d into the plasma processing chamber 110a, in accordance with some embodiments. The dilution gas 146d is mixed with the oxygen atom-containing gas 510, in accordance with some embodiments. The oxygen atom-containing gas 510 is diluted by the dilution gas 146d, in accordance with some embodiments.

The cleaning process includes generating an oxygen atom-containing plasma P4 by exciting the oxygen atom-containing gas 510, in accordance with some embodiments. The oxygen atom-containing plasma P4 reacts with organic compound residues Rc in the plasma processing chamber 110a to volatilize the organic compound residues Rc into a gaseous carbon compound Gc, in accordance with some embodiments. The cleaning process includes removing the gaseous carbon compound Gc from the plasma processing chamber 110a using the gas exhaust unit 154, in accordance with some embodiments.

As shown in FIG. 5C, the cleaning process includes introducing a fluorine-containing gas 310 into the plasma processing chamber 110a, in accordance with some embodiments. The cleaning process further includes introducing a dilution gas 146d into the plasma processing chamber 110a, in accordance with some embodiments. The cleaning process includes generating a fluorine-containing plasma P3 by exciting the fluorine-containing gas 310, in accordance with some embodiments.

The fluorine-containing plasma P3 reacts with the silicon-containing residues Rs in the plasma processing chamber 110a to volatilize the silicon-containing residues Rs into a gaseous silicon compound Gs, in accordance with some embodiments. The cleaning process includes removing the gaseous silicon compound Gs from the plasma processing chamber 110a using the gas exhaust unit 154, in accordance with some embodiments.

In some other embodiments, the formation sequence of the organic plasma P2, the oxygen atom-containing plasma P4, and the fluorine-containing plasma P3 is changed. For example, the fluorine-containing plasma P3 may be formed firstly to remove the silicon-containing residues Rs, the organic plasma P2 may be formed secondly to remove the metal compound residues Rm (as shown in FIG. 3A), and the oxygen atom-containing plasma P4 may be formed thirdly to remove the organic compound residues Rc.

The formation sequence of the organic plasma P2, the oxygen atom-containing plasma P4, and the fluorine-containing plasma P3 may vary according to the stacking sequence of the silicon-containing residues Rs, the organic compound residues Rc, and the metal compound residues Rm. For example, if the metal compound residues Rm covers the silicon-containing residues Rs, the organic plasma P2 is formed earlier than the fluorine-containing plasma P3.

Figure 6A:
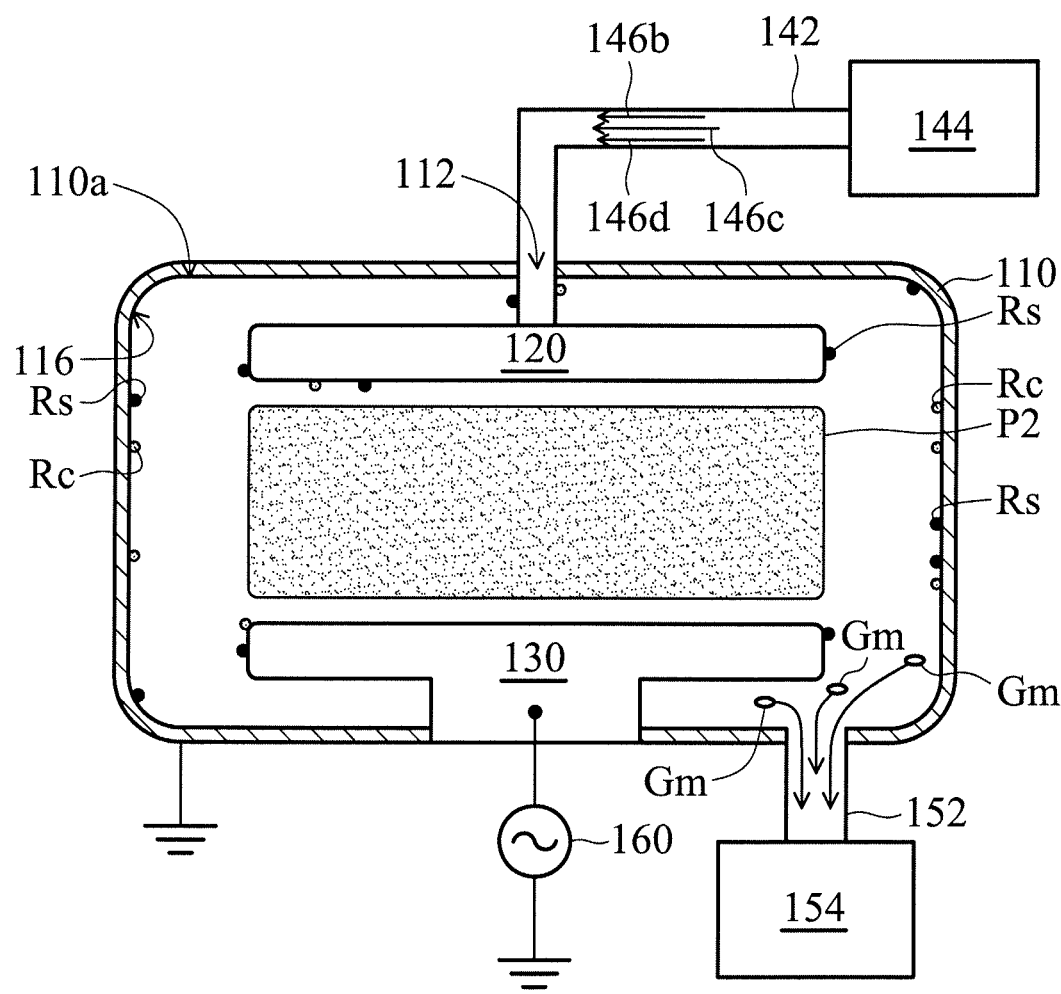
FIGS. 6A-6C are cross-sectional views of various stages of a process for cleaning a plasma processing chamber, in accordance with some embodiments.
Figure 6B:
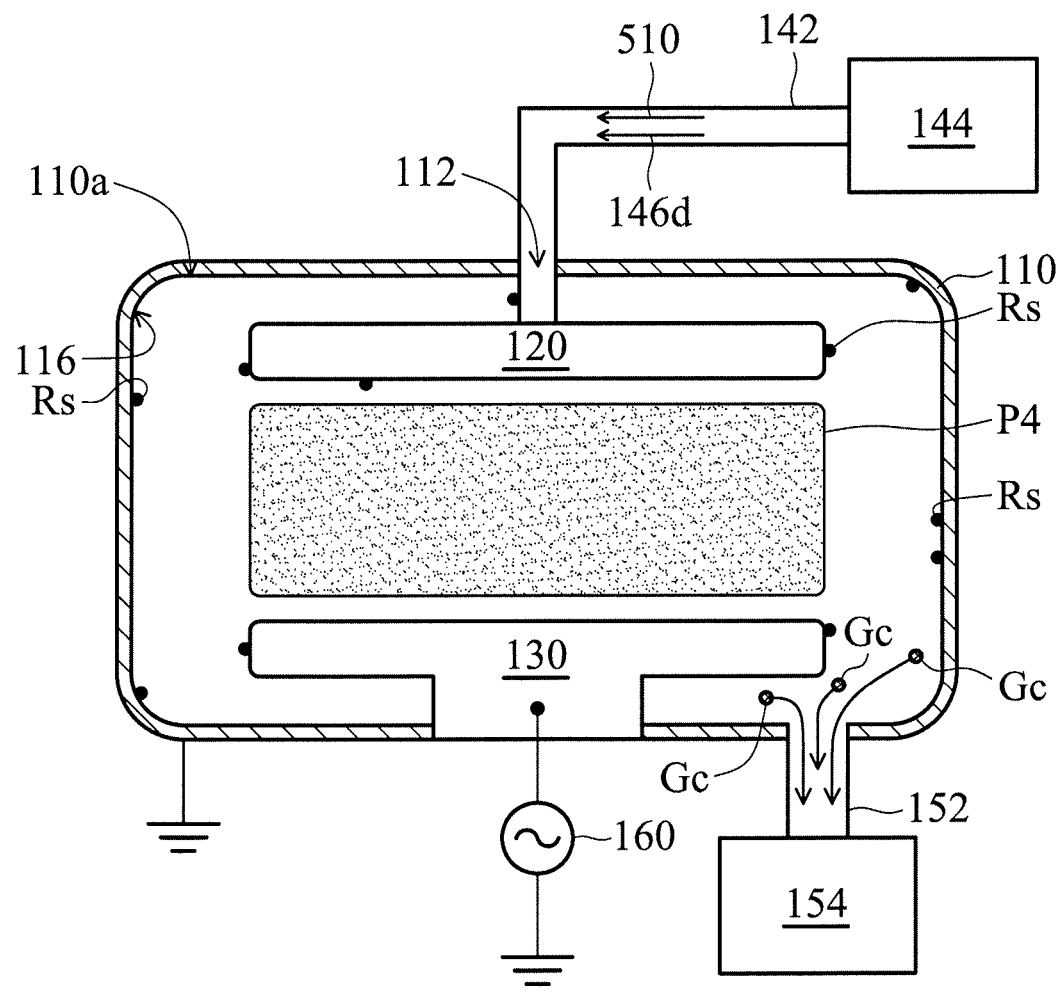
Figure 6C:
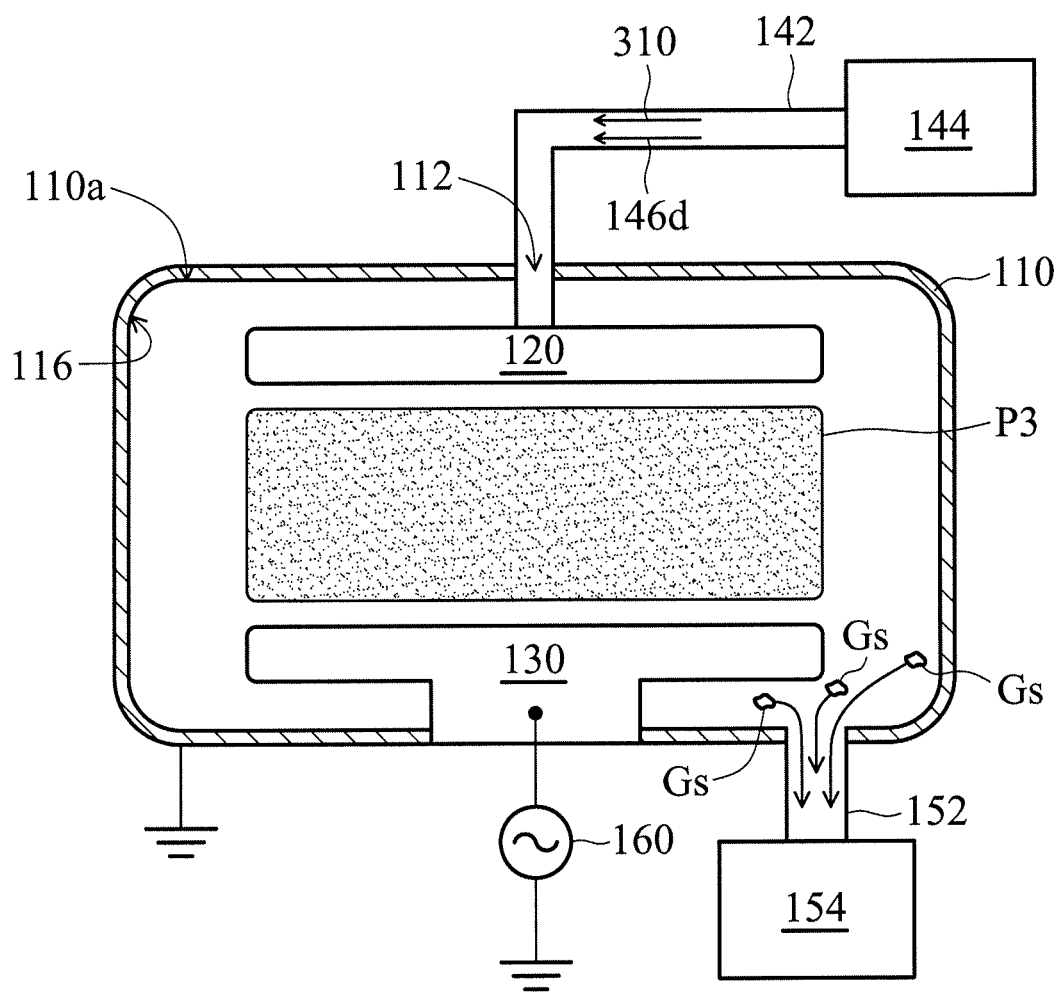

FIGS. 6A-6C are cross-sectional views of various stages of a process for cleaning a plasma processing chamber, in accordance with some embodiments. The cleaning process of FIGS. 6A-6C is similar to that of FIGS. 3B and 5A-5C, except that the cleaning process of FIGS. 6A-6C is a wafer-less cleaning process, in accordance with some embodiments.

In some embodiments, the cleaning process of FIGS. 6A-6C is also referred to as a wafer-less auto-clean (WAC) process. Elements designated by the same reference numbers as those in FIGS. 3B and 5A-5C have structures and materials similar thereto. Therefore, the detailed descriptions thereof will not be repeated herein.

After the step of FIG. 3A, as shown in FIG. 6A, the substrate 10 is removed from the plasma processing chamber 110a, in accordance with some embodiments. Thereafter, as shown in FIG. 6A, the process of FIGS. 3B and 5A is performed to remove the metal compound residues Rm from the plasma processing chamber 110a, in accordance with some embodiments.

As shown in FIG. 6B, the cleaning process of FIG. 5B is performed to remove the organic compound residues Rc from the plasma processing chamber 110a, in accordance with some embodiments. As shown in FIG. 6C, the cleaning process of FIG. 5C is performed to remove the silicon-containing residues Rs from the plasma processing chamber 110a, in accordance with some embodiments.

In accordance with some embodiments, methods for cleaning a plasma processing chamber and a substrate are provided. The methods (for cleaning a plasma processing chamber and a substrate) use an organic plasma to volatilize metal compound residues in a plasma processing chamber so as to remove the metal compound residues. Therefore, the methods maintain the plasma processing chamber clean for a long period of time. The methods elongate the mean time between (open chamber) clean, therefore the cleaning process improves the process efficiency and the process yield.

In accordance with some embodiments, a method for cleaning a substrate is provided. The method includes providing a substrate. Metal compound residues are formed over the substrate. The method includes exposing the substrate to an organic plasma to volatilize the metal compound residues.

In accordance with some embodiments, a method for cleaning a substrate is provided. The method includes providing a plasma processing apparatus including a housing, an upper electrode plate, a lower electrode pedestal, and a gas exhaust unit. A plasma processing chamber is in the housing. The upper electrode plate and the lower electrode pedestal are in the plasma processing chamber. The housing has a gas outlet, and the gas exhaust unit is connected to the gas outlet. The method includes providing a substrate in the plasma processing chamber and over the lower electrode pedestal. Metal compound residues are formed over the substrate. The method includes exposing the substrate to an organic plasma to volatilize the metal compound residues into a gaseous metal compound. The method includes exhausting the gaseous metal compound from the plasma processing chamber using the gas exhaust unit.

In accordance with some embodiments, a method for cleaning a substrate is provided. The method includes forming a metal compound layer over a substrate. The method includes performing a plasma etching process to remove a portion of the metal compound layer. During the plasma etching process, metal compound residues are formed over the metal compound layer. The method includes exposing the metal compound layer to an organic plasma to volatilize the metal compound residues into a gaseous metal compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a substrate, comprising:
providing a substrate;
depositing an etch stop layer over the substrate, wherein the etch stop layer comprises a metal compound;
depositing a dielectric layer over the etch stop layer;
performing a plasma etching process to remove a first portion of the dielectric layer and a second portion of the etch stop layer, wherein metal compound residues are formed from the second portion and formed over at least one of the dielectric layer or the etch stop layer, the plasma etching process forms an opening in the dielectric layer and a recess in the etch stop layer, and the opening is over the recess; and
exposing the substrate to an organic plasma to volatilize the metal compound residues, wherein the organic plasma removes the etch stop layer exposed by the opening.

2. The method for cleaning a substrate as claimed in claim 1, wherein the plasma etching process comprises a fluorine-containing plasma etching process.

3. The method for cleaning a substrate as claimed in claim 1, further comprising:
after the volatilization of the metal compound residues, exposing the substrate to an oxygen atom-containing plasma to volatilize organic compound residues formed over the substrate.

4. The method for cleaning a substrate as claimed in claim 1, wherein the organic plasma is generated from a gas, the gas comprises an organic gas, and the organic gas is made of a hydrocarbon compound or an alcohol compound.

5. The method for cleaning a substrate as claimed in claim 4, wherein the hydrocarbon compound comprises alkane, alkene, or alkyne, and the alcohol compound comprises $CH_3OH$, $C_2H_5OH$, or $C_3H_7OH$.

6. The method for cleaning a substrate as claimed in claim 5, wherein the gas further comprises a chain termination gas, and the chain termination gas is made of hydrogen, carbon oxide, carbon dioxide, oxygen, or a combination thereof.

7. A method for cleaning a substrate, comprising:
providing a plasma processing apparatus comprising a housing, an upper electrode plate, a lower electrode pedestal, and a gas exhaust unit, wherein a plasma processing chamber is in the housing, the upper electrode plate and the lower electrode pedestal are in the plasma processing chamber, the housing has a gas outlet, and the gas exhaust unit is connected to the gas outlet;
providing a substrate in the plasma processing chamber and over the lower electrode pedestal;
forming a metal compound layer over the substrate;
performing a plasma etching process to remove a portion of the metal compound layer, wherein during the plasma etching process, metal compound residues are formed over the substrate;
exposing the substrate to an organic plasma to volatilize the metal compound residues into a gaseous metal compound; and
exhausting the gaseous metal compound from the plasma processing chamber using the gas exhaust unit.

8. The method for cleaning a substrate as claimed in claim 7, wherein the gaseous metal compound comprises metal organics.

9. The method for cleaning a substrate as claimed in claim 8, wherein the metal organics comprise an alkyl metal compound, an alkoxy metal compound, an alkoxy alkyl metal compound, or a combination thereof.

10. The method for cleaning a substrate as claimed in claim 9, wherein the metal organics comprise aluminum, gallium, indium, or titanium.

11. The method for cleaning a substrate as claimed in claim 7, wherein the metal compound residues are in a solid state.

12. The method for cleaning a substrate as claimed in claim 11, wherein the metal compound residues are made of a Group III-A metal fluoride, a Group III-A metal oxide, a Group III-A metal nitride, a Group IV-B metal fluoride, a Group IV-B metal oxide, or a Group IV-B metal nitride.

13. The method for cleaning a substrate as claimed in claim 7, wherein the organic plasma is generated from a gas, the gas comprises an organic gas, and the organic gas is made of a hydrocarbon compound or an alcohol compound.

14. The method for cleaning a substrate as claimed in claim 13, wherein the hydrocarbon compound comprises alkane, alkene, or alkyne.

15. The method for cleaning a substrate as claimed in claim 13, wherein the alcohol compound comprises $CH_3OH$, $C_2H_5OH$, or $C_3H_7OH$.

16. A method for cleaning a substrate, comprising:
forming a metal compound layer over a substrate;
performing a plasma etching process to remove a portion of the metal compound layer, wherein during the plasma etching process, metal compound residues are formed over the metal compound layer; and
exposing the metal compound layer to an organic plasma to volatilize the metal compound residues into a gaseous metal compound.

17. The method for cleaning a substrate as claimed in claim 16, wherein the plasma etching process comprises a fluorine-containing plasma etching process.

18. The method for cleaning a substrate as claimed in claim 16, further comprising:
after the volatilization of the metal compound residues, exposing the metal compound layer to an oxygen atom-containing plasma to volatilize organic compound residues formed over the metal compound layer.

19. The method for cleaning a substrate as claimed in claim 16, wherein the organic plasma is generated from a gas, the gas comprises an organic gas, and the organic gas is made of a hydrocarbon compound or an alcohol compound.

20. The method for cleaning a substrate as claimed in claim 19, wherein the hydrocarbon compound comprises alkane, alkene, or alkyne, and the alcohol compound comprises $CH_3OH$, $C_2H_5OH$, or $C_3H_7OH$.

* * * * *